(12) United States Patent
Blaettler et al.

(10) Patent No.: US 9,672,921 B2
(45) Date of Patent: Jun. 6, 2017

(54) DEVICE AND METHOD FOR STORING DATA IN A PLURALITY OF MULTI-LEVEL CELL MEMORY CHIPS

(71) Applicant: INTERNATIONAL BUSINESS MACHINES CORPORATION, Armonk, NY (US)

(72) Inventors: Tobias Blaettler, Rueschlikon (CH); Thomas Mittelholzer, Rueschlikon (CH); Nikolaos Papandreou, Rueschlikon (CH); Thomas Parnell, Rueschlikon (CH); Charalampos Pozidis, Rueschlikon (CH); Milos Stanisavljevic, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/849,028

(22) Filed: Sep. 9, 2015

(65) Prior Publication Data

US 2016/0070506 A1    Mar. 10, 2016

(30) Foreign Application Priority Data

Sep. 10, 2014    (GB) .................... 1415951.1

(51) Int. Cl.
*G11C 16/10*    (2006.01)
*G11C 7/10*    (2006.01)
(Continued)

(52) U.S. Cl.
CPC .......... *G11C 16/10* (2013.01); *G06F 11/1048* (2013.01); *G11C 7/1006* (2013.01); *G11C 11/5628* (2013.01); *G11C 2211/5648* (2013.01)

(58) Field of Classification Search
CPC .... G06F 3/0638; G06F 3/0604; G06F 3/0683; G06F 11/1048; G11C 16/10; G11C 7/1006; G11C 11/5628; G11C 2211/5648
See application file for complete search history.

(56) References Cited

U.S. PATENT DOCUMENTS 7,269,778 B1 * 9/2007 Feng .................... H03M 5/145
 341/59
8,578,243 B2    11/2013 Sommer et al.
(Continued)

FOREIGN PATENT DOCUMENTS

WO    2007132453 A    11/2007

*Primary Examiner* — Rocio Del Mar Perez-Velez
(74) *Attorney, Agent, or Firm* — Tutunjian & Bitetto, P.C.; David M. Quinn (57) ABSTRACT

A device for storing data in a plurality of multi-level cell memory chips. The device includes a scrambling unit to generate a plurality of candidate scrambled sequences of data by performing a plurality of scrambling operations on a sequence of data to be stored, a calculation unit to calculate a cost function for each of the plurality of candidate scrambled sequences of data, the result of each cost function being indicative of a balancing degree of subsequences of a candidate scrambled sequence, when the subsequences of the candidate scrambled sequence are written to the plurality of multi-level cell memory chips, a selection unit to select one of the candidate scrambled sequences of data based on the results of the cost functions, and a storing unit to store the selected candidate scrambled sequence of data in the multi-level cell memory chips by storing the subsequences across the multi-level memory chips.

15 Claims, 4 Drawing Sheets

(51) Int. Cl.
*G11C 11/56* (2006.01)
*G06F 11/10* (2006.01)

(56) References Cited

U.S. PATENT DOCUMENTS

| | | | |
|---|---|---|---|
| 2008/0151618 A1* | 6/2008 | Sharon | G06F 11/1068 |
| | | | 365/185.02 |
| 2010/0306619 A1* | 12/2010 | Yang | G06F 11/1072 |
| | | | 714/758 |
| 2012/0297271 A1* | 11/2012 | Sommer | G06F 11/1048 |
| | | | 714/766 |
| 2013/0219247 A1 | 8/2013 | Yang | |
| 2013/0297986 A1 | 11/2013 | Cohen | |
| 2014/0115234 A1 | 4/2014 | Woo et al. | |
| 2014/0156914 A1 | 6/2014 | Marrow et al. | |
| 2014/0310534 A1* | 10/2014 | Gurgi | G06F 12/1408 |
| | | | 713/193 |

* cited by examiner

| t (clk) | $E_1(t)$ | $E_2(t)$ | $E_3(t)$ | ... | $E_T(t)$ | ... | $E_{T-n-1}(t)$ |
|---|---|---|---|---|---|---|---|
| 1 | $B_1$ | $B_2$ | $B_3$ | ... | $B_T$ | ... | $B_{T+n-1}$ |
| 2 | | $B_2+B_1$ | $B_3+B_2$ | ... | $B_T+B_{T-1}$ | ... | $B_{T+n-1}+B_{T+n-2}$ |
| 3 | | | $B_3+B_2+B_1$ | ... | $B_T+B_{T-1}+B_{T-2}$ | ... | $B_{T+n-1}+B_{T+n-2}+B_{T+n-3}$ |
| ... | ... | ... | ... | ... | ... | ... | ... |
| T | | | | | $B_T+B_{T-1}+...+B_1$ | ... | $B_{T+n-1}+B_{T+n-2}+...+B_n$ |

DEVICE AND METHOD FOR STORING DATA IN A PLURALITY OF MULTI-LEVEL CELL MEMORY CHIPS

BACKGROUND

Technical Field

The invention relates to a device and a method for storing data in a plurality of multi-level cell memory chips, each of the multi-level cell memory chips having a plurality of memory cells, each memory cell having a plurality of programmable levels.

Related Art

A multi-level cell (MLC) is a memory element capable of storing more than a single bit of information. This is achieved by using multiple levels per cell to allow more bits to be stored in each cell. A MLC memory chip may comprise a plurality of memory cells. A plurality of MLC memory chips may form a MLC memory array.

In order to retrieve information reliably from an MLC memory cell, it may be desirable to have an estimation of the channel statistics being used for the detection and decoding algorithms. This may be, in particular, useful if the channel statistics are not stationary in time and cannot be determined by characterization, for example, the drift effect in Phase Change Memory (PCM). If data is read from and written to a memory cell in small chunks of data (e.g., 32 cells), then it is possible that one of the MLC levels (or states) is only written a small number of times or even not at all. This data asymmetry can make it very difficult to estimate channel statistics. It may thus be desired that it is programmed, e.g., written, to all MLC levels as many times as possible.

One solution might be to use a balanced code to ensure that each MLC level is written the same number of times. However, the coding overhead required to balance the data sequence is very high for the small block lengths required by memory applications. Another solution might be to perform enumerative encoding and decoding to ensure that each level is written a least k times. This would be very efficient in terms of coding rate, but the encoders/decoders are not suitable for low-latency memory applications and may suffer from error propagation, for instance, as errors in the read-back data can lead to a decoding failure.

U.S. Pat. No. 8,578,243 B2 discloses a method for data storage including defining a set of scrambling sequences. Each data word is scrambled using a respective scrambling sequence selected from the set and the level of randomness of the scrambled data word is determined. If the level of randomness is determined to be less than some pre-determined level of randomness, then the scrambled data word is stored in a memory device. The level of randomness is defined to be the balancing degree of the scrambled data word. Such a method can ensure that the scrambled data word is close to balanced, however if the scrambled data word is split into sub-words and stored across multiple chips, it is possible for the sub-words to be highly asymmetric. In order to solve this problem, one might perform the same method of scrambling, but on the sub-words rather than on the sequence itself. However, since there is some overhead involved in the scrambling method, this approach might be inefficient.

Accordingly, it is an aspect of the present invention to provide a device and a method for storing data across multiple memory chips and improving the symmetry of data across the memory levels.

SUMMARY

According to an embodiment of a first aspect, a device for storing data in a plurality of multi-level cell memory chips is provided. Each of the multi-level cell memory chips has a plurality of memory cells, each memory cell having a plurality of programmable levels. The device comprises a scrambling unit configured to generate a plurality of candidate scrambled sequences of data by performing a plurality of scrambling operations on a sequence of data to be stored, a calculation unit configured to calculate a cost function for each of the plurality of the generated candidate scrambled sequences of data, the result of each of the cost functions being indicative of a balancing degree of subsequences of a candidate scrambled sequence, when the subsequences of the candidate scrambled sequence are written to the plurality of multi-level cell memory chips, a selection unit configured to select one of the candidate scrambled sequences of data based on the results of the calculated cost functions, and a storing unit configured to store the selected candidate scrambled sequence of data in the plurality of multi-level cell memory chips by storing the subsequences of the selected candidate scrambled sequence across the plurality of multi-level memory chips.

A multi-level cell (MLC) memory chip may also be called resistive memory. Such a MLC memory chip may comprise a plurality of memory cells representing the fundamental storage unit (also referred to as "memory cell"). Each memory cell can be set to a number of different states which exhibit different electrical resistance characteristics. Information is recorded by exploiting the different states to represent different data values. To read recorded data, the cell-state is detected via measurements which exploit the differing resistance characteristics to differentiate between possible cell-states. A plurality of MLC memory chips can form a MLC memory array.

Embodiments of the device are based on the idea to encode data that is to be written across multiple memory cells in such a way as to ensure that each MLC level on every chip is programmed an equal number of times.

When input data, also called user data word, would be split into sub-words and each sub-word would be scrambled separately, the data written to each chip would be balanced, e.g., spread across the levels of one chip equally. However, the overhead due to scrambling on each sub-word individually would be large.

Thus, according to embodiments of the device, the scrambling unit performs scrambling on the whole data word. This is more efficient, as only one scrambling unit is needed. The scrambled data word itself is also balanced or at least approximately balanced.

Further, when dividing the scrambled data word into sub-words or subsequences, which are then stored across the plurality of chips, the sub-words are also balanced or at least approximately balanced. This may be achieved by generating a set of candidate scrambled sequences and using a cost function to determine which of the candidate scrambled sequences is closest to the ideal case where each of the sub-sequences written to each chip is balanced. A cost function is thus indicative of a balancing degree of the subsequences of the corresponding candidate scrambled sequence.

The scrambling unit may perform a plurality of scrambling operations on the whole data word in order to generate a plurality of scrambled sequences. The calculation unit may calculate a cost function for each of the scrambled sequences.

In order to determine the best candidate sequence, e.g., the sequence where the sub-sequence on each chip is as close to balanced as possible, a selection unit may be provided which selects one of the candidate scrambled sequences based on the cost functions. The selected sequence is then used as data word to be written to the memory array.

The respective unit, e.g., the scrambling unit, may be implemented in hardware and/or in software. If said unit is implemented in hardware, it may be embodied as a device, e.g., as a computer or as a processor or as a part of a system, e.g., a computer system. If said unit is implemented in software, it may be embodied as a computer program product, as a function, as a routine, as a program code or as an executable object.

According to an embodiment, the selection unit is configured to provide a comparison result by comparing the results of the cost functions and to select one of the candidate scrambled sequences of data based on the comparison result.

The selection unit can, for example, compare the values of the cost functions and determine an average value, a minimum value or a maximum value of the cost functions. Based on any kind of value, the selection unit may perform the comparison and thus the selection of one of the scrambled sequences.

According to a further embodiment, the selection unit is configured to select the candidate scrambled sequence of data being associated with the cost function having the smallest value of all results of the cost functions.

When it is assumed that each memory cell has four levels, the cost function may be defined as the minimum number of times any of the four possible levels are written to a chip. According to this embodiment, the selection unit determines which of the cost functions has a value which is equal or at least nearest to zero from all cost functions.

According to a further embodiment, the calculation unit is configured to calculate the cost functions F(X) by means of the following formula:

$$F(X) = \max_{c=1,2,\ldots,C} \left[ \max_{s=0,1,2,\ldots,S} (N_s(S_c(X))) - \min_{s=0,1,2,\ldots,S} (N_s(S_c(X))) \right]$$

where X denotes a candidate scrambled sequence of data, s denotes a state of a memory cell, $N_s(X)$ denotes the number of states s contained in the sequence X, $S_c(X)$ denotes a subsequence of X that is to be written to the c-th of the memory chips, S denotes the total number of (possible) multi-level cell states (or levels), and C denotes the total number of memory chips.

The cost function, in this case, defines the maximum difference between the maximum number of times a cell level is written to a chip and the minimum number of times a cell level is written to a chip. When each sub-sequence or sub-word of X is balanced, the cost function is equal to zero.

According to a further embodiment, the selection unit is configured to select one of the candidate scrambled sequences of data by means of the following formula:

$$W = \underset{X=Y \oplus E_1, Y \oplus E_2, \ldots, Y \oplus E_3}{\operatorname{argmin}} [F(X)]$$

where Y denotes the sequence of data to be stored, and $E_i$ denotes a scrambling pattern used to generate the candidate scrambled sequence of data X.

The selection unit selects one of the candidate scrambled sequences that minimizes this function.

According to a further embodiment, the device includes an encoding unit configured to encode the selected candidate scrambled sequence of data before storing using an error correcting code.

The error correcting code may be any kind of error correcting code being suitable. Linear error correcting codes are particularly suitable since it is possible to perform scrambling after error-correction encoding by pre-encoding the scrambling patterns and inserting a symbol (called the scrambling identifier) that can be used to identify which scrambling pattern was used to store the data.

According to a further embodiment, the error correcting code is a cyclic error correcting code, in particular a non-binary cyclic error correcting code.

Such codes may be any kind of cyclic error correction code, for instance a Reed-Solomon code or a BCH code.

According to a further embodiment, each of the plurality of scrambling operations corresponds to a cyclic shift of the sequence of data to be stored.

According to this embodiment, the scrambling unit performs a cyclic shift of the user data word a plurality of times, each time about a different amount. Thus, the user data word, or sequence of data to be stored, is shifted about different amounts to generate the plurality of candidate scrambled sequences.

According to a further embodiment, the scrambling unit is configured to perform the plurality of scrambling operations using a plurality of scrambling patterns, in particular wherein each of the scrambling operations corresponds to a XOR operation between the sequence of data to be stored and one of the plurality of scrambling sequences.

As mentioned above, the scrambling unit is configured to use a plurality of scrambling patterns. The scrambling patterns may be stored within a storage of the device. The number of scrambling patterns corresponds to the number of generated candidate scrambled sequences. Instead of XOR operations, also NAND operations or other logic operations may be used.

According to a further embodiment, the device includes a scrambling pattern generator configured to generate, in each clock cycle, a new set of scrambling patterns, in particular wherein the scrambling pattern generator is configured to generate in each clock cycle a new set of scrambling patterns based on a stored basis set of scrambling patterns and a set of scrambling patterns generated in the previous clock cycle.

From a small set of basis patterns, a larger set of scrambling patterns, also called code words, can be obtained by various means like XOR or cyclic shift, depending on the error correcting code (ECC) that is used before storing the scrambled data. Using this architecture, it is possible to evaluate the cost function for e.g., 4,096 scrambling patterns in 16 clock cycles requiring only 22 KB of memory, thus enabling an efficient FPGA implementation.

According to a further embodiment, the scrambling unit is configured to use the stored basis set of scrambling patterns as the plurality of scrambling patterns in a first clock cycle and wherein the scrambling unit is configured to use in each further clock cycle the set of scrambling patterns generated in the previous clock cycle.

A large number of scrambling patterns (e.g., more than 4096) may be required. The amount of memory (or indeed registers) required to store all of these patterns in memory might not be practical especially for implementation in FPGA. Existing solutions to the problem of generating scrambling patterns (such as that described in U.S. Pat. No. 8,578,243 B2) are based on generating random sequences using linear feedback shift registers (LFSR) initialized with some seed. This approach might not be suitable for the suggested device, since an extremely low latency may be required and furthermore the set of scrambling patterns should be pre-encoded, so if quasi-random sequences are generated using LFSRs, then they should be encoded causing a further degradation in latency.

Thus, according to this embodiment, a partially-parallel guided scrambling architecture is used that only requires a small number of pre-encoded scrambling patterns to be stored in a memory of the device.

In each clock cycle, the new set of scrambling patterns of the previous clock cycle is used for guided scrambling of the data. Thus, in the first clock cycle, the basis set of scrambling patterns is used, in the second clock cycle, the set of scrambling patterns generated in the first clock cycle is used and so on.

According to a further embodiment, the scrambling unit is configured to insert a scrambling identifier into the generated candidate scrambled sequences for identifying the used scrambling pattern.

The scrambling identifier contains information regarding the used scrambling pattern and used scrambling operation.

According to a further embodiment, the basis set of scrambling patterns is chosen such that the new sets of scrambling patterns have a unique scrambling identifier.

The base patterns should be chosen such that is can be ensured that the scrambling identifier for all generated scrambling patterns is unique. Using such a scrambling identifier, it is possible to read back the data being stored on the memory chips as the used scrambling pattern and scrambling operation is known.

According to a further embodiment, the scrambling pattern generator is configured to pre-encode the basis set of scrambling patterns using a linear error correction code. According to this embodiment, the scrambling pattern generator is further configured to generate, in each clock cycle, a new set of scrambling patterns by performing XOR operations on a stored basis set of scrambling patterns and/or a set of scrambling patterns generated in the previous clock cycle. For instance, n+T−1 base scrambling patterns are stored in a memory: $B_1, B_2, \ldots, B_{T+n-1}$. At each clock cycle, new scrambling patterns E are generated based on the patterns generated in the previous clock cycle and the stored patterns: $E_k(t)=E_k(t-1)+B_{k-t+1}$. n patterns are output at each clock cycle ($E_T(t)$ to $E_{T+n-1}(t)$). When linear error correcting codes are used, XOR of any two code words is also a code word. Thus, the code word generation is deterministic.

According to a further embodiment, the scrambling pattern generator is configured to pre-encode the basis set of scrambling patterns using a cyclic error correction code. According to this embodiment, the scrambling pattern generator is further configured to generate in each clock cycle a new set of scrambling patterns by performing cyclic shift operations on a stored basis set of scrambling patterns and/or a set of scrambling patterns generated in the previous clock cycle.

New scrambling patterns may be generated taking cyclic shifts of the basis set of scrambling patterns (or the patterns generated at a previous clock cycle). As in the case of a linear error correction code, also in the case of cyclic error correction codes, a cyclic shift of any code word of a cyclic code is also a code word.

It should be noted that the base patterns should be chosen to ensure that the bits that correspond to the scrambling identifier of the resulting larger set of patterns never coincide. This can be achieved using a recursive algorithm.

According to an embodiment of a second aspect, a memory device is provided. The memory device comprises a plurality of multi-level cell memory chips, each of the multi-level cell memory chips having a plurality of memory cells, each memory cell having a plurality of programmable levels, and a read/write apparatus for reading and writing data in the memory cells, wherein the read/write apparatus includes a device of the above described first aspect.

According to an embodiment of a third aspect, a method for storing data in a plurality of multi-level cell memory chips is provided. The method includes generating a plurality of candidate scrambled sequences of data by performing stored plurality of scrambling operations on a sequence of data to be stored, calculating a cost function for each of the plurality of the generated candidate scrambled sequences of data, the result of each of the cost functions being indicative of a balancing degree of subsequences of a candidate scrambled sequence, when the subsequences of the candidate scrambled sequence are written to the plurality of multi-level cell memory chips, selecting one of the candidate scrambled sequences of data based on the results of the calculated cost functions, and storing the selected candidate scrambled sequence of data in the plurality of multi-level cell memory chips by storing the subsequences of the selected candidate scrambled sequence across the plurality of multi-level memory chips.

According to an embodiment of a fourth aspect, the presents principles provide a computer program or computer program product comprising a program code for executing at least one step of the method of the third aspect for storing data in a multi-level cell memory array when run on at least one computer.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION OF THE EMBODIMENTS

Figure 1:
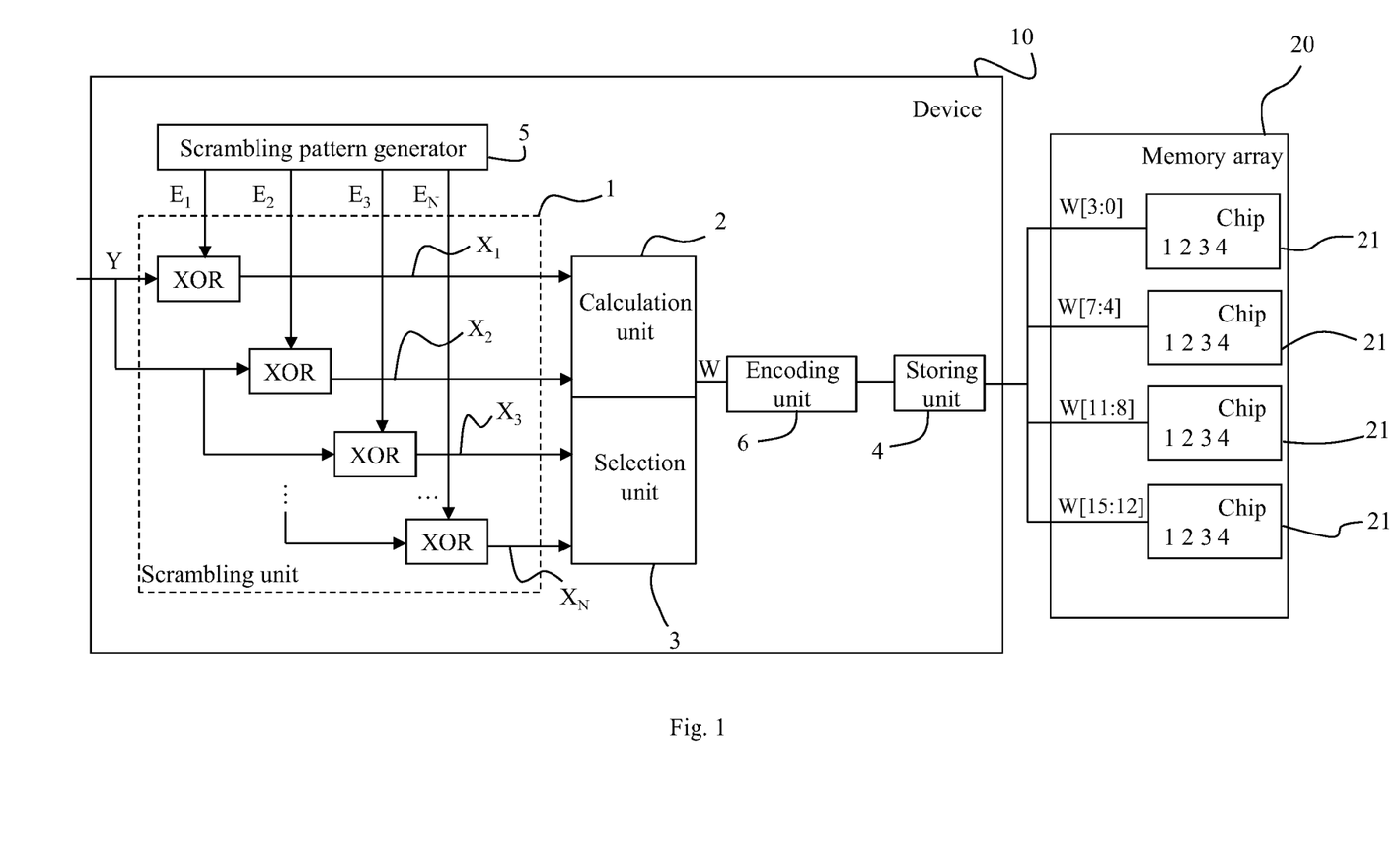
FIG. 1 shows an embodiment of a device for storing data in a plurality of multi-level cell memory chips.

FIG. 1 shows an embodiment of a device 10 for storing data in a multi-level cell memory array 20. The multi-level cell memory array 20 has a plurality of memory chips 21 each having a plurality of memory cells having a plurality of programmable levels (1, 2, 3, 4).

The device 10 includes a scrambling unit 1, a calculation unit 2, a selection unit 3, an encoding unit 6, a storing unit 4 and a scrambling pattern generator 5.

A sequence of data to be stored, also called user data word Y is input to the device 10. The scrambling unit 1 performs a guided scrambling on the user data word Y. This means that the scrambling unit 1 uses a plurality of scrambling patterns $E_1$ to $E_N$ for scrambling (XOR) the user data word Y as a whole. As a result, a plurality of scrambled user data words $X_1=Y+E_1$, $X_2=Y+E_2$, $X_3=Y+E_3$, ... $X_N=Y+E_N$ is input to the calculation unit 2 and the selection unit 3, which can be integrated in one single component.

The calculation unit 3 calculates a cost function for each of the plurality of the generated scrambled sequences of data. The cost function provides a measure of how far the candidate sequence is from the ideal case where each of the subsequences written to the memory chips 21 is balanced. The selection unit 3 then selects one of the scrambled sequences based on the calculated cost functions.

The selected sequence, also called written data word W, is determined based on a randomness of the scrambled data sub-words. The scrambled data word W itself is balanced, for instance W=[1, 2, 3, 4, 1, 2, 3, 4, 1, 2, 3, 4, 1, 2, 3, 4]. The sub-words of W (W[3:0], W[7:4], W[11:8], W[15:12]) are also balanced. The storing unit 4 stores the selected scrambled sequence W of data in the plurality of MLC memory chips 21, forming the multi-level cell memory array 20.

The scrambling pattern generator 5 generates a set of scrambling patterns in each clock cycle. The scrambling pattern generator 5 will be described below with reference to FIG. 3 in greater detail.

Figure 2:
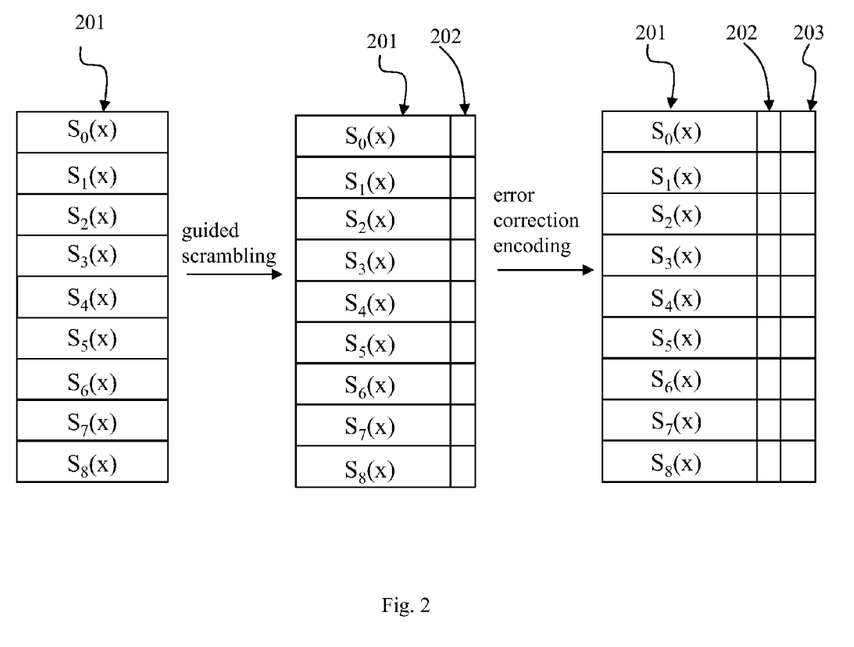
FIG. 2 shows an embodiment of the data format used when storing the encoded data.

FIG. 2 shows an example of the data format when storing the encoded data. The encoding unit 6 performs error correction encoding.

$S_i(x)$ 201 denotes a sub-sequence of the sequence of data before scrambling with $i \in [1, \ldots, 8]$. Each sub-sequence will be written to a different memory chip. After guided scrambling, a scrambling identifier 202 is inserted to ensure that when the data is retrieved it is possible to know which scrambling pattern has been used.

After the error correction encoding, parity cells 203 are inserted according to the encoding procedure of the chosen error correction scheme.

Figure 3:
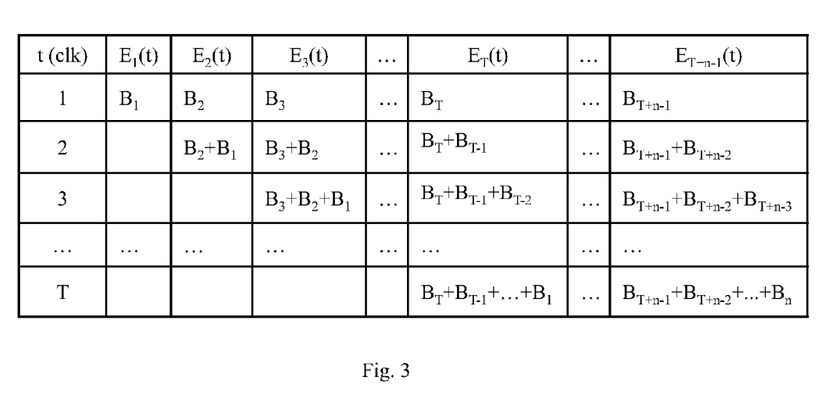
FIG. 3 shows an embodiment of a scrambling pattern generator.

FIG. 3 shows an example of an algorithm that can be used to generate a large set of scrambling patterns from a small set of base patterns. It is important to choose the base patterns $B_1$ to $B_{T+n-1}$ in such a way as to ensure that the scrambling identifiers of all generated scrambling patterns are unique. This is essential for error-free de-scrambling.

The base patterns $B_1$ to $B_{T+n-1}$ could be chosen according to the following method (also other methods are possible):

$B_1, B_2, \ldots, B_i$ denote the first i base patterns. $S(B_1, B_2, \ldots B_i)$ is the set of scrambling pattern identifiers generated by $B_1, B_2, \ldots B_i$. It is assumed that for the first i base patterns, all generated scrambling identifiers are unique:

$$|S(B_1,B_2, \ldots B_i)|=iT$$

Then it can be shown that, if $B_{i+1}$ is chosen, according to the following constraints:

$$B_{i+1} \text{ is not in the set } S(B_1,B_2, \ldots B_i)$$

$$B_{i+1} \text{ is not in the set } S(B_1,B_2, \ldots B_i)+B_i$$

$$B_{i+1} \text{ is not in the set } S(B_1,B_2, \ldots B_i)+B_{i-1}$$

$$\ldots$$

$$B_{i+1} \text{ is not in the set } S(B_1,B_2, \ldots B_i)+B_{i-T+1}$$

the following is satisfied:

$$|S(B_1,B_2, \ldots B_{i+1})|=(i+1)T.$$

This may provide a recursive algorithm for choosing the bits of the base patterns that correspond to the scrambling identifier to ensure that the resulting scrambling identifiers of all generated patterns are unique. The other bits of the base patterns can be chosen at random.

In each clock cycle t(clk), new patterns are generated by the scrambling pattern generator 5.

At each clock cycle, new scrambling patterns are generated based on the patterns generated in the previous clock cycle and the patterns from memory: $E_n(t)=E_n(t-1)+B_{n-t+1}$. The scrambling pattern generator 5 uses XOR units to generate the new patterns.

If scrambling is being performed using pre-encoded scrambling sequences, the scrambling pattern generator should always generate sequences that belong in the error correction code (e.g., that are code words). If a linear error correction code is employed, the XOR of two code words is guaranteed to be a code word. Thus, as long as the base patterns are chosen to be code words, then all patterns generated later on will also be code words.

Figure 4:
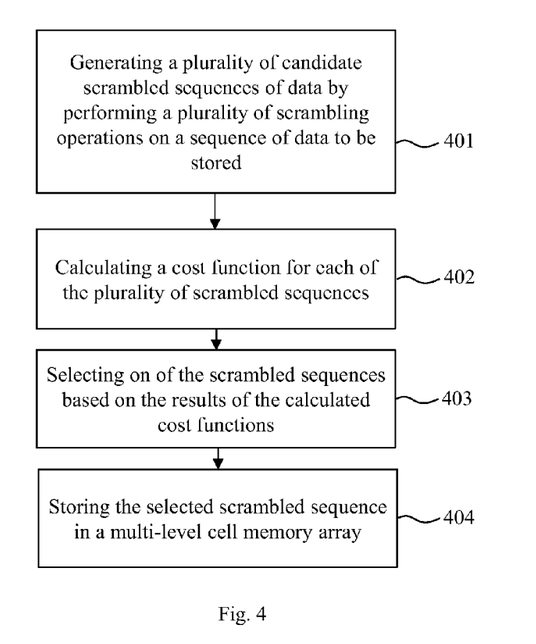
FIG. 4 shows an embodiment of a sequence of method steps for storing data in a multi-level cell memory array.

FIG. 4 shows an embodiment of a sequence of method steps for storing data in a multi-level cell memory array. The method of FIG. 4 has the following steps 401-404.

In step 401, a plurality of candidate scrambled sequences are generated by performing a plurality of XOR operations between the sequence of data to be stored and a set of scrambling patterns.

In step 402, a cost function for each of the plurality of the generated scrambled sequences of data is calculated. The cost function provides a measure of how far the candidate sequence is from the ideal case where each of the subsequences written to the memory chips is balanced.

In step 403, one of the scrambled sequences of data is selected based on the results of the calculated cost functions.

In step 404, the selected scrambled sequence of data is stored as scrambled data sub-words in the plurality of multi-level cell memory chips.

Computerized devices may be suitably designed for implementing embodiments of the present invention as described herein. In that respect, it may be appreciated that the method described herein are largely non-interactive and automated. In exemplary embodiments, the method described herein may be implemented either in an interactive, partly-interactive or non-interactive system. The method described herein may be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above method of FIG. 4 may be implemented in software, as an executable program, the latter executed by suitable digital processing devices. More generally, embodiments of the present invention may be implemented wherein general-purpose digital computers, such as personal computers, workstations, etc., are used.

Figure 5:
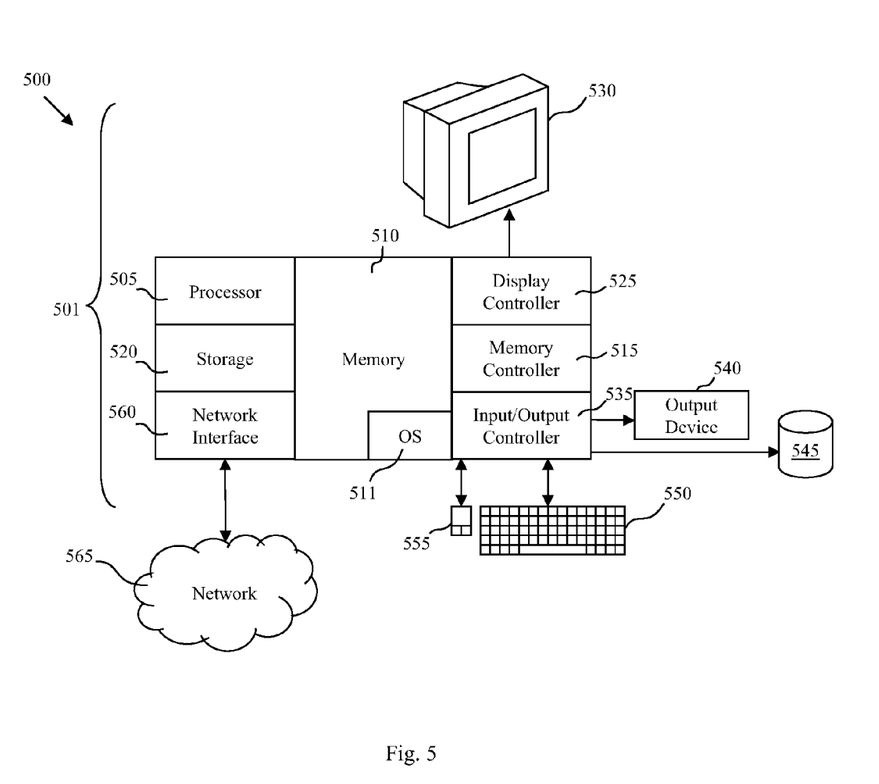
FIG. 5 shows a schematic block diagram of an embodiment of a system configured to perform the method for storing data in a multi-level cell memory array.

For instance, the system 500 depicted in FIG. 5 schematically represents a computerized unit 501, e.g., a general-purpose computer. In exemplary embodiments, in terms of hardware architecture, as shown in FIG. 5, the unit 501 includes a processor 505, memory 510 coupled to a memory controller 515, and one or more input and/or output (I/O) devices 540, 545, 550, 555 (or peripherals) that are communicatively coupled via a local input/output controller 535. Further, the input/output controller 535 may be, but is not limited to, one or more buses or other wired or wireless connections, as is known in the art. The input/output controller 535 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 505 is a hardware device for executing software, particularly that stored in memory 510. The processor 505 may be any custom made or commercially available processor, a central processing unit (CPU), an auxiliary processor among several processors associated with the computer 501, a semiconductor based microprocessor (in the form of a microchip or chip set), or generally any device for executing software instructions.

The memory 510 may include any one or combination of volatile memory elements (e.g., random access memory) and nonvolatile memory elements. Moreover, the memory 510 may incorporate electronic, magnetic, optical, and/or other types of storage media. Note that the memory 510 may have a distributed architecture, where various components are situated remote from one another, but may be accessed by the processor 505.

The software in memory 510 may include one or more separate programs, each of which comprises an ordered listing of executable instructions for implementing logical functions. In the example of FIG. 5, the software in the memory 510 includes the method described herein in accordance with exemplary embodiments and a suitable operating system (OS) 511. The OS 511 essentially controls the execution of other computer programs, such as the method as described herein (e.g., FIG. 4), and provides scheduling, input-output control, file and data management, memory management, and communication control and related services. The method described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 510, so as to operate properly in connection with the OS 511. Furthermore, the method may be written as an object oriented programming language, which has classes of data and methods, or a procedure programming language, which has routines, subroutines, and/or functions.

Possibly, a conventional keyboard 550 and mouse 555 may be coupled to the input/output controller 535. Other I/O devices 540-555 may include sensors (especially in the case of network elements), e.g., hardware devices that produce a measurable response to a change in a physical condition like temperature or pressure (physical data to be monitored). Typically, the analog signal produced by the sensors is digitized by an analog-to-digital converter and sent to controllers 535 for further processing. Sensor nodes are ideally small, consume low energy, are autonomous and operate unattended.

In addition, the I/O devices 540-555 may further include devices that communicate both inputs and outputs. The system 500 may further include a display controller 525 coupled to a display 530. In exemplary embodiments, the system 500 may further include a network interface or transceiver 560 for coupling to a network 565.

The network 565 transmits and receives data between the unit 501 and external systems. The network 565 is possibly implemented in a wireless fashion, e.g., using wireless protocols and technologies, such as WiFi, WiMax, etc. The network 565 may be a fixed wireless network, a wireless local area network (LAN), a wireless wide area network (WAN) a personal area network (PAN), a virtual private network (VPN), intranet or other suitable network system and includes equipment for receiving and transmitting signals.

The network 565 may also be an IP-based network for communication between the unit 501 and any external server, client and the like via a broadband connection. In exemplary embodiments, network 565 may be a managed IP network administered by a service provider. Besides, the network 565 may be a packet-switched network such as a LAN, WAN, Internet network, etc.

If the unit 501 is a PC, workstation, intelligent device or the like, the software in the memory 510 may further include a basic input output system (BIOS). The BIOS is stored in ROM so that the BIOS may be executed when the computer 501 is activated.

When the unit 501 is in operation, the processor 505 is configured to execute software stored within the memory 510, to communicate data to and from the memory 510, and to generally control operations of the computer 501 pursuant to the software. The method described herein and the OS 511, in whole or in part are read by the processor 505, typically buffered within the processor 505, and then executed. When the method described herein (e.g., with reference to FIG. 4) are implemented in software, the method may be stored on any computer readable medium, such as storage 520, for use by or in connection with any computer related system or method.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

The invention claimed is:

1. A device for storing data in a plurality of multi-level cell memory chips, each of the multi-level cell memory chips having a plurality of memory cells, each memory cell having a plurality of programmable levels, the device comprising:
a scrambling unit to generate a plurality of candidate scrambled sequences of data by performing a plurality of scrambling operations on a sequence of data to be stored;
a calculation unit to calculate a cost function for each of the plurality of the generated candidate scrambled sequences of data, the result of each cost function being indicative of a balancing degree of subsequences of a candidate scrambled sequence, when the subsequences of the candidate scrambled sequence are written to the plurality of multi-level cell memory chips, wherein each cost function is defined as a maximum difference between a maximum number of times a cell level is written to a chip and a minimum number of times the cell level is written to the chip;
a selection unit to select one of the plurality of candidate scrambled sequences of data based on the results of the calculated cost functions; and
a storing unit to store the selected candidate scrambled sequence of data in the plurality of multi-level cell memory chips by storing the subsequences of the selected candidate scrambled sequence across the plurality of multi-level memory chips.

2. The device of claim 1, wherein the selection unit provides a comparison result by comparing the results of the cost functions and selects one of the plurality of candidate scrambled sequences of data based on the comparison result.

3. The device of claim 2, wherein the selection unit selects the candidate scrambled sequence of data being associated with the cost function having a smallest value of all results of the cost functions.

4. The device of claim 1, wherein the calculation unit calculates the cost functions F(X) by means of the following formula:

$$F(X) = \max_{c=1,2,\ldots,C} \left[ \max_{s=0,1,2,\ldots,S} (N_s(S_c(X))) - \min_{s=0,1,2,\ldots,S} (N_s(S_c(X))) \right]$$

where X denotes a candidate scrambled sequence of data, s denotes a state of a memory cell, $N_s(X)$ denotes a number of states s contained in the candidate scrambled sequence of data X, $S_c(X)$ denotes a subsequence of X that is to be written to a c-th of the plurality of multi-level cell memory chips, S denotes a number of multi-level cell states, and C denotes a total number of memory chips.

5. The device of claim 1, further comprising an encoding unit to encode the selected candidate scrambled sequence of data before storing using an error correcting code.

6. The device of claim 1, wherein each of the plurality of scrambling operations corresponds to a cyclic shift of the sequence of data to be stored.

7. The device of claim 1, wherein the scrambling unit performs the plurality of scrambling operations using a plurality of scrambling patterns, wherein the each of the scrambling operations corresponds to an XOR operation between the sequence of data to be stored and one of the plurality of scrambling patterns.

8. The device of claim 7, further comprising a scrambling pattern generator to generate in each clock cycle a new set of scrambling patterns, wherein the scrambling pattern generator generates in each clock cycle the new set of scrambling patterns based on a stored basis set of scrambling patterns and a set of scrambling patterns generated in a previous clock cycle.

9. The device of claim 8, wherein the scrambling unit uses the stored basis set of scrambling patterns as the plurality of scrambling patterns in a first clock cycle and wherein the scrambling unit is further configured to use in each further clock cycle the set of scrambling patterns generated in the previous clock cycle.

10. The device of claim 7, wherein the scrambling unit inserts a scrambling identifier into the plurality of candidate scrambled sequences for identifying the plurality of scrambling patterns used.

11. The device of claim 8, wherein the stored basis set of scrambling patterns is chosen such that the new set of scrambling patterns has a unique scrambling identifier.

12. The device of claim 8, wherein the scrambling pattern generator pre-encodes the stored basis set of scrambling patterns using a linear error correction code and wherein the scrambling pattern generator generates in each clock cycle the new set of scrambling patterns by performing XOR operations on the stored basis set of scrambling patterns and/or the set of scrambling patterns generated in the previous clock cycle.

13. The device of claim 8, wherein the scrambling pattern generator pre-encodes the stored basis set of scrambling patterns using a cyclic error correction code and wherein the scrambling pattern generator generates in each clock cycle the new set of scrambling patterns ($E_1$, $E_2$, $E_3$, ..., $E_N$) by performing cyclic shift operations on the stored basis set of scrambling patterns and/or the set of scrambling patterns generated in the previous clock cycle.

14. A memory device, comprising:
a plurality of multi-level cell memory chips, each of the multi-level cell memory chips having a plurality of memory cells, each memory cell having a plurality of programmable levels; and
a read/write apparatus for reading and writing data in the plurality of memory chips, wherein the read/write apparatus includes a device as claimed in claim 1.

15. A method for storing data in a plurality of multi-level cell memory chips, each of the multi-level cell memory chips having a plurality of memory cells, each memory cell having a plurality of programmable levels, the method comprising:
generating a plurality of candidate scrambled sequences of data by performing a plurality of scrambling operations on a sequence of data to be stored;
calculating a cost function for each of the plurality of candidate scrambled sequences of data, the result of each cost function being indicative of a balancing degree of subsequences of a candidate scrambled sequence, when the subsequences of the candidate scrambled sequence are written to the plurality of multi-level cell memory chips, wherein each cost function is defined as a maximum difference between a maximum number of times a cell level is written to a chip and a minimum number of times the cell level is written to the chip;
selecting one of the plurality of candidate scrambled sequences of data based on the results of the calculated cost functions; and
storing the selected candidate scrambled sequence of data in the plurality of multi-level cell memory chips by storing the subsequences of the selected candidate scrambled sequence across the plurality of multi-level cell memory chips.

* * * * *